(12) United States Patent
Salman

(10) Patent No.: US 8,759,171 B2
(45) Date of Patent: Jun. 24, 2014

(54) FIELD CONTROLLED DIODE WITH POSITIVELY BIASED GATE

(71) Applicant: Texas Instruments Incorporated, Dallas, TX (US)

(72) Inventor: Akram A. Salman, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/099,975

(22) Filed: Dec. 8, 2013

(65) Prior Publication Data
US 2014/0087530 A1  Mar. 27, 2014

Related U.S. Application Data

(62) Division of application No. 13/563,916, filed on Aug. 1, 2012, now Pat. No. 8,610,183.

(60) Provisional application No. 61/515,178, filed on Aug. 4, 2011.

(51) Int. Cl.
*H01L 21/337* (2006.01)

(52) U.S. Cl.
USPC .......................................................... 438/194

(58) Field of Classification Search
CPC . H01L 27/0629; H01L 29/7391; H01L 21/20; H01L 27/0255; H01L 27/0605; H01L 29/7813; H01L 29/7397; H01L 29/1095

USPC .......................................................... 438/194
See application file for complete search history.

(56) References Cited

U.S. PATENT DOCUMENTS

| | | | | |
|---|---|---|---|---|
| 3,648,066 A * | 3/1972 | Terman | ........................... | 377/79 |
| 5,624,860 A * | 4/1997 | Plumton et al. | ............... | 438/193 |
| 5,889,298 A * | 3/1999 | Plumton et al. | ............... | 257/285 |
| 5,959,332 A * | 9/1999 | Ravanelli et al. | ............. | 257/360 |
| 6,097,046 A * | 8/2000 | Plumton | ........................ | 257/266 |
| 6,177,298 B1 * | 1/2001 | Quigley | ........................ | 438/135 |
| 6,734,476 B2 * | 5/2004 | Moessner et al. | ............. | 257/289 |
| 8,310,011 B2 * | 11/2012 | Salman et al. | ................ | 257/360 |
| 2012/0256233 A1 * | 10/2012 | Cui et al. | ...................... | 257/195 |

* cited by examiner

*Primary Examiner* — Bilkis Jahan
(74) *Attorney, Agent, or Firm* — Wade J Brady, III; Frederick J. Telecky, Jr.

(57) ABSTRACT

An integrated circuit containing a field controlled diode which includes a p-type channel region between an upper gate and a lower n-type depletion gate, a p-type anode in a p-type anode well abutting the channel region, and an n-type cathode in a p-type anode well abutting the channel region opposite from the anode well. An n-type lower gate link connects the lower gate to the surface of the substrate. A surface control element is located at the surface of the channel region between the cathode and the upper gate. A process of forming the integrated circuit containing the field controlled diode is described.

10 Claims, 16 Drawing Sheets

FIELD CONTROLLED DIODE WITH POSITIVELY BIASED GATE

CROSS-REFERENCE TO RELATED APPLICATIONS

This application is a divisional of U.S. Nonprovisional application Ser. No. 13/563,916, "Field Controlled Diode With Positively Biased Gate", filed Aug. 1, 2012, which claims the benefit of U.S. Provisional Application No. 61/515,178, "Field Controlled Diode (FCD) With Positively-Biased Gate Control for ESD Protection of CMOS and BICOMS Technologies", filed Aug. 4, 2011, both of which are incorporated herein by reference in their entireties.

FIELD OF THE INVENTION

This invention relates to the field of integrated circuits. More particularly, this invention relates to field controlled diodes in integrated circuits.

BACKGROUND OF THE INVENTION

An integrated circuit may include a protective circuit connected to an input/output (I/O) pad to shunt electrostatic discharges away from other circuits. Electrostatic discharges are voltage transients which are commonly outside the operating voltage range of input and output signals of the integrated circuit. Negative voltage excursions, that is, voltage transients below the lower limit of the operating voltage range of the integrated circuit, may be shunted to the substrate of the integrated circuit through a simple diode in which the cathode is connected to the I/O pad and the anode is connected to, or is part of, the substrate. It may be desirable to pass positive signals within the operating voltage range to the other circuits while shunting positive voltage excursions higher than the operating voltage range away from the other circuits. Providing both functions may require a more complicated device than a simple diode. It may also be desirable to integrate the device providing positive voltage excursion protection into the integrated circuit without adding process steps.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed on a monolithic p-type substrate to include a field controlled diode which includes a lateral p-type channel between an upper gate and a lower n-type depletion gate. A p-type anode of the field controlled diode is connected in series to the channel, and may be connected to an I/O pad of the integrated circuit. An n-type cathode is connected in series to the channel opposite the anode, and is connected to a voltage sink of the integrated circuit, such as ground. A surface control element is located between the cathode and the upper gate. The upper gate and the lower junction depletion gate are biased to a positive voltage to pass positive voltages on the anode in the operating voltage range of the integrated circuit to other circuits, while providing a shunt path for positive voltage excursions above the operating voltage range. When the upper gate and the lower junction depletion gate are grounded or floated, the field controlled diode provides a shunt path for all positive voltages on the anode.

DETAILED DESCRIPTION OF EXAMPLE EMBODIMENTS

Figure 1A:
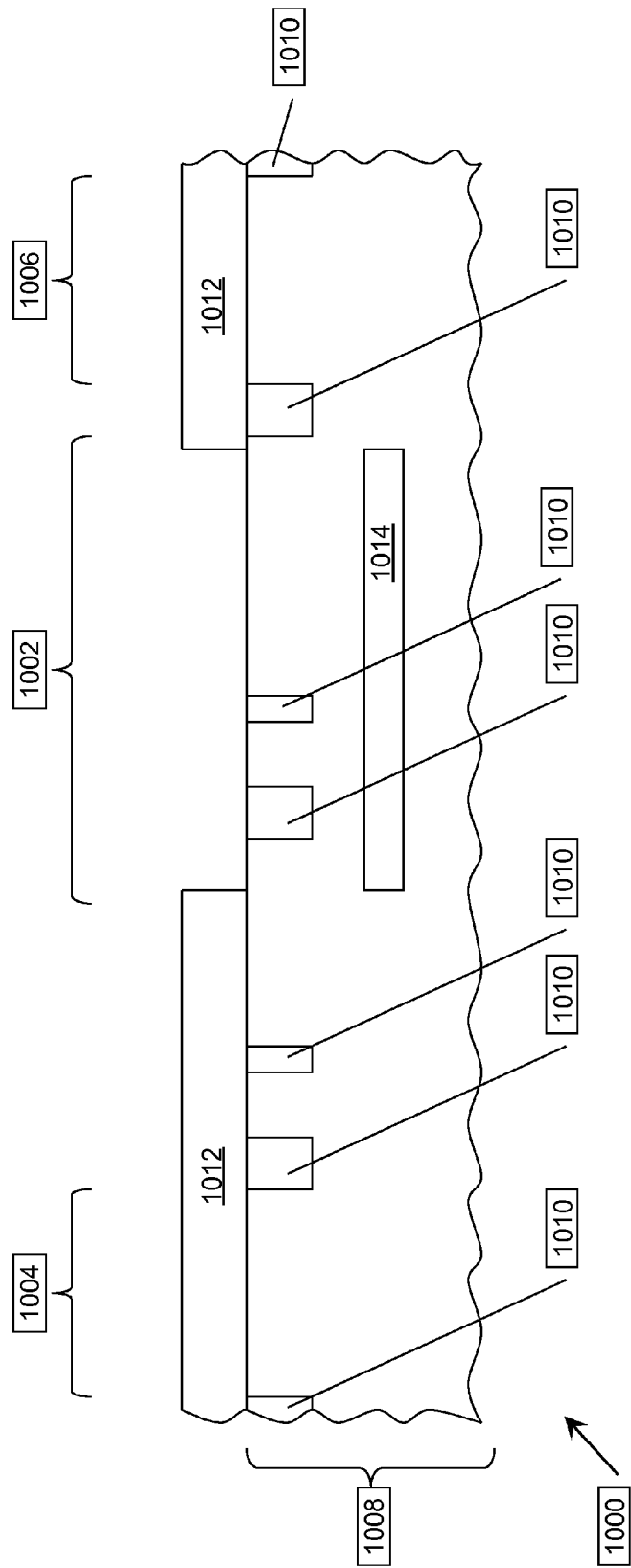
FIG. 1A through FIG. 1H are cross sections of an integrated circuit containing a field controlled diode formed according to an embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may be formed on a monolithic p-type substrate to include a field controlled diode which includes a lateral p-type channel between an upper gate and a lower n-type depletion gate. The upper gate may be a metal oxide semiconductor (MOS) gate, or an n-type region forming a junction depletion gate. A p-type anode of the field controlled diode is connected in series to the channel, and may be connected to an I/O pad of the integrated circuit. An n-type cathode is connected in series to the channel opposite the anode, and is connected to a voltage sink of the integrated circuit, such as ground. A surface control element is located between the cathode and the upper gate. The surface control element may be a field plate, a silicide block dielectric layer or a field oxide element. The upper gate and the lower junction depletion gate are biased to a positive voltage to pass positive voltages on the anode in an operating voltage range of the integrated circuit to other circuits, while providing a shunt path for positive voltage excursions above the operating voltage range. When the upper gate and the lower junction depletion gate are grounded or floated, the field controlled diode provides a shunt path for all positive voltages on the anode. An n-channel MOS (NMOS) transistor may be formed in the integrated circuit in series with the lower junction depletion gate.

The p-type anode of the field controlled diode may be formed concurrently with p-type source and drain regions of p-channel MOS (PMOS) transistors in the integrated circuit. Similarly, the n-type cathode of the field controlled diode may be formed concurrently with n-type source and drain regions of NMOS transistors in the integrated circuit. N-type wells and p-type wells in the field controlled diode may be formed concurrently with n-type wells containing PMOS transistor and p-type wells containing NMOS transistors, respectively.

FIG. 1A through FIG. 1H are cross sections of an integrated circuit containing a field controlled diode formed according to an embodiment, depicted in successive stages of fabrication. Referring to FIG. 1A, the integrated circuit 1000 includes an area defined for the field controlled diode 1002, an area defined for an NMOS transistor 1004 and an area defined for a PMOS transistor 1006. The integrated circuit 1000 is formed in and on a monolithic substrate 1008 which may be a single crystal silicon wafer, a hybrid orientation technology (HOT) wafer with regions of different crystal orientations, or other material appropriate for fabrication of the integrated circuit 1000. The substrate 1008 is p-type in the field controlled diode area 1002. Elements of field oxide 1010 are formed at a top surface of the substrate 1008, for example of silicon dioxide between 250 and 600 nanometers thick, by shallow trench isolation (STI) or local oxidation of silicon (LOCOS) processes. A deep n-type well ion implant mask 1012 is formed over the top surface of the substrate 1008 so as to expose the substrate 1008 in an area to be implanted in the field controlled diode area 1002. The deep n-type well ion implant mask 1012 may be formed of photoresist between 3 and 5 microns thick, or other dielectric material such as silicon dioxide between 2 and 4 microns thick for example by forming an etch mask over a layer of silicon dioxide and removing unwanted silicon dioxide by an etch process. The deep n-type well ion implant mask 1012 may also expose the substrate 1008 in other areas of the integrated circuit 1000. A deep n-type well ion implant operation is performed on the integrated circuit 1000 which implants n-type dopants such as phosphorus into the substrate 1008 to form a deep n-type well implanted layer 1014 at a desired depth below the top surface of the substrate 1008. In one version of the instant embodiment, the deep n-type well ion implant operation may implant the n-type dopants at a dose between $3 \times 10^{12}$ atoms/cm$^2$ and $5 \times 10^{13}$ atoms/cm$^2$ at an energy between 500 keV and 1.5 MeV, so that a top surface of the deep n-type well implanted layer 1014 is between 500 nanometers and 2 microns below the top surface. The deep n-type well ion implant mask 1012 may be removed after the deep n-type well ion implant operation is completed.

Figure 1B:
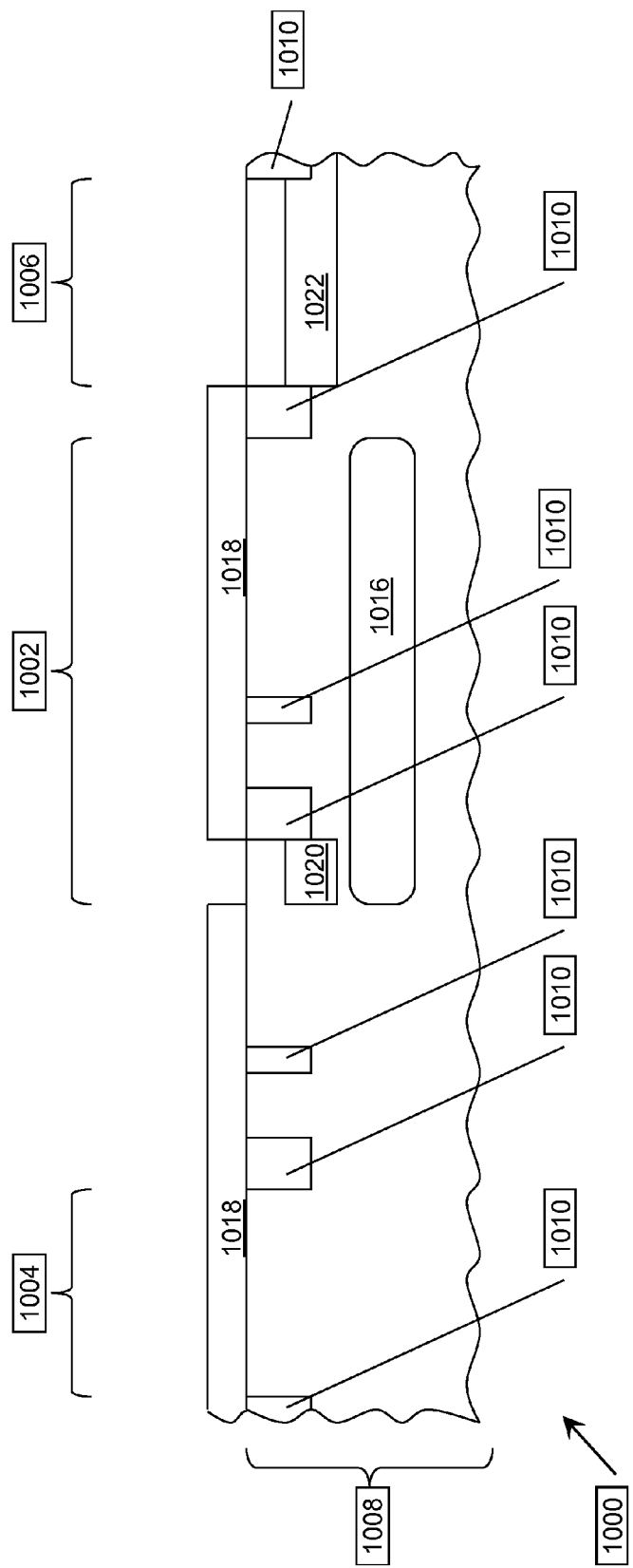

Referring to FIG. 1B, a deep n-well anneal operation is performed on the integrated circuit 1000 which heats the substrate 1008 causing the n-type dopants in the deep n-type well implanted layer 1014 of FIG. 1A to diffuse and at least a portion of the n-type dopants to become electrically activated, forming an n-type lower depletion gate 1016 hereafter referred to a the lower depletion gate 1016. The deep n-type well anneal operation may be a rapid thermal anneal, for example, at a temperature between 1025° C. and 1060° C. for 20 to 45 seconds.

An n-type well ion implant mask 1018 is formed over the top surface of the substrate 1008 so as to expose the substrate 1008 in an area to be implanted in the field controlled diode area 1002, and possibly in the PMOS transistor area 1006. The n-type well ion implant mask 1018 may be formed of photoresist for example between 700 nanometers and 1500 nanometers thick. An n-type well ion implant operation is performed on the integrated circuit 1000 which implants n-type dopants such as phosphorus and/or arsenic through the exposed area of the n-type well ion implant mask 1018 into the substrate 1008 to form a lower gate link implanted layer 1020 in the field controlled diode area 1002 over a portion of the lower depletion gate 1016. If the n-type well ion implant mask 1018 exposes the substrate 1008 in the PMOS transistor area 1006, the n-type well ion implant operation forms a PMOS body well implanted layer 1022 in the substrate 1008 in the PMOS transistor area 1006. In one version of the instant embodiment, the n-type well ion implant operation may implant the n-type dopants at a dose between $1 \times 10^{13}$ atoms/cm$^2$ and $2 \times 10^{14}$ atoms/cm$^2$ at an energy between 250 keV and 500 keV. The n-type well ion implant mask 1018 may be removed after the n-type well ion implant operation is completed.

Figure 1C:
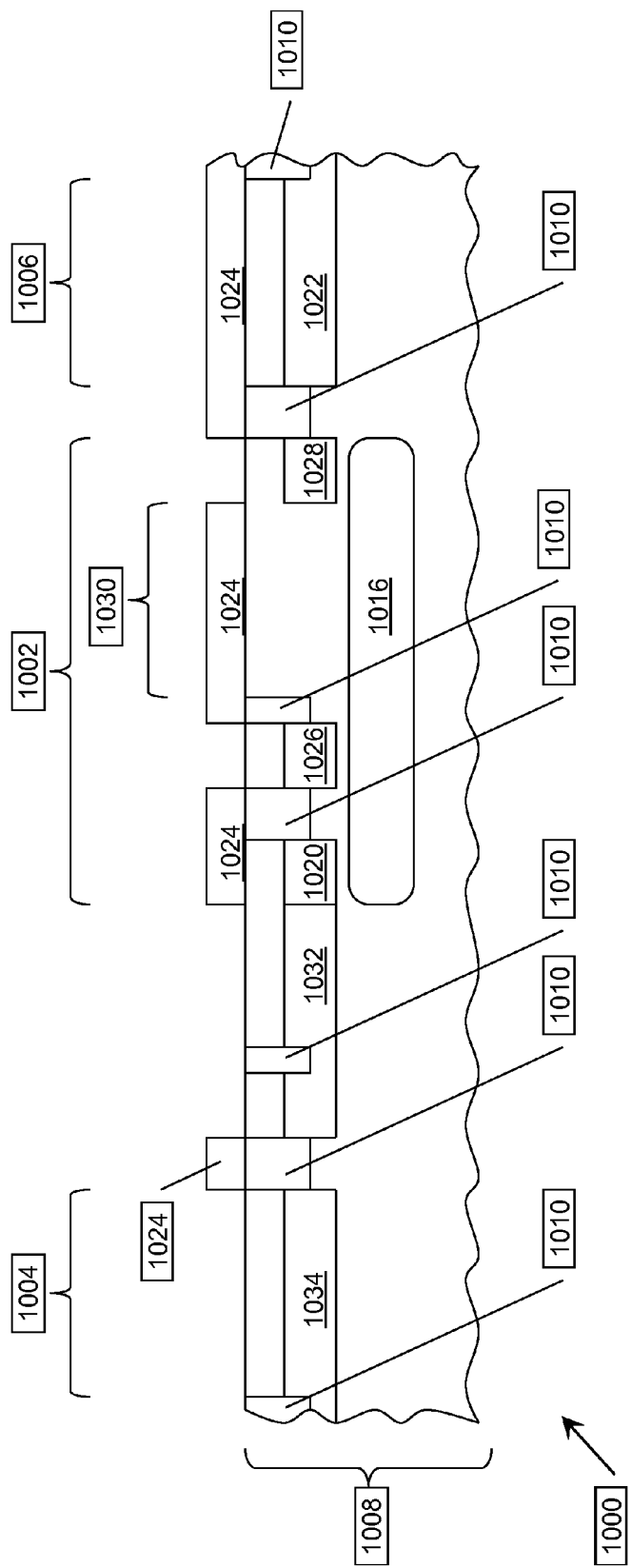

Referring to FIG. 1C, a p-type well ion implant mask 1024 is formed over the top surface of the substrate 1008 so as to expose the substrate 1008 in an area to be implanted in the field controlled diode area 1002, and possibly in the NMOS transistor area 1004. The p-type well ion implant mask 1024 may be formed of photoresist for example between 700 nanometers and 1500 nanometers thick. A p-type well ion implant operation is performed on the integrated circuit 1000 which implants p-type dopants such as boron into the substrate 1008 to form an anode well implanted layer 1026 in the field controlled diode area 1002 over a portion of the lower depletion gate 1016, a cathode well implanted layer 1028 by a channel region 1030 in the field controlled diode area 1002 over a portion of the lower depletion gate 1016 separated from the anode well implanted layer 1026, in the field controlled diode area 1002, and possibly a passgate body well implanted layer 1032 adjacent to the field controlled diode area 1002. If the p-type well ion implant mask 1024 exposes the substrate 1008 in the NMOS transistor area 1004, the p-type well ion implant operation forms an NMOS body well implanted layer 1034 in the substrate 1008 in the NMOS transistor area 1004. In one version of the instant embodiment, the p-type well ion implant operation may implant the p-type dopants at a dose between $1 \times 10^{13}$ atoms/cm$^2$ and $2 \times 10^{14}$ atoms/cm$^2$ at an energy between 125 keV and 250 keV. The p-type well ion implant mask 1024 may be removed after the p-type well ion implant operation is completed.

Figure 1D:
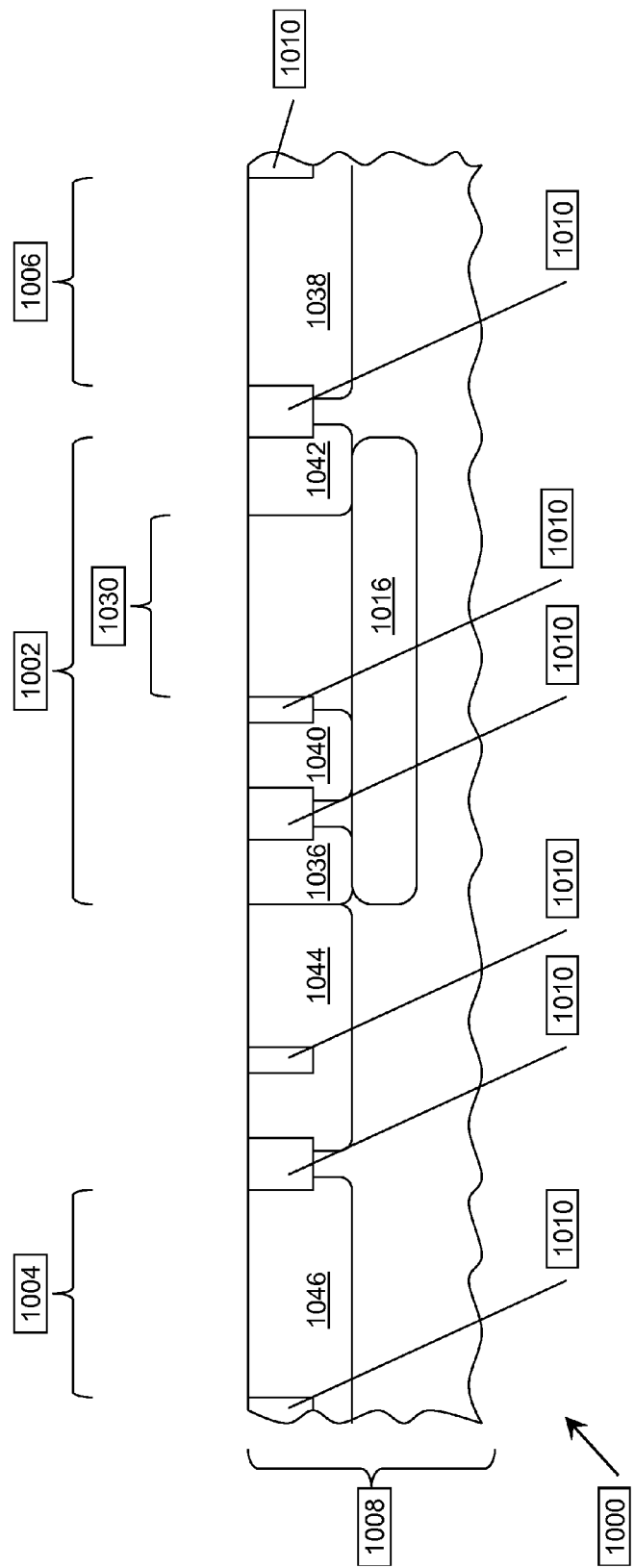

Referring to FIG. 1D, a well anneal operation is performed on the integrated circuit 1000 which heats the substrate 1008 causing the dopants which were implanted in the n-type well ion implant operation and the p-type well ion implant operation to diffuse and at least a portion of the dopants to become electrically activated. The n-type dopants in the lower gate link implanted layer 1020 of FIG. 1B form an n-type lower gate link 1036 which makes electrical contact with the lower depletion gate 1016. The n-type dopants in the PMOS body well implanted layer 1022 of FIG. 1B, if formed, form an n-type PMOS body well 1038. The p-type dopants in the anode well implanted layer 1026 of FIG. 1C form a p-type anode well 1040. The p-type dopants in the cathode well implanted layer 1028 of FIG. 1C form a p-type cathode well 1042. The p-type dopants in the passgate body well implanted layer 1032 of FIG. 1C, if formed, form a p-type passgate body well 1044. The p-type dopants in the NMOS body well implanted layer 1034 of FIG. 1C, if formed, form a p-type NMOS body well 1046. The well anneal operation may be similar to the deep n-well anneal operation, for example a rapid thermal anneal at a temperature between 1040° C. and 1060° C. for 25 to 35 seconds. Forming the PMOS body well 1038 concurrently with the lower gate link 1036 may advantageously reduce fabrication cost and complexity of the integrated circuit 1000. Similarly, forming the NMOS body well 1046 and the passgate body well 1044 concurrently with the anode well 1040 and the cathode well 1042 may advantageously reduce fabrication cost and complexity of the integrated circuit 1000.

Figure 1E:
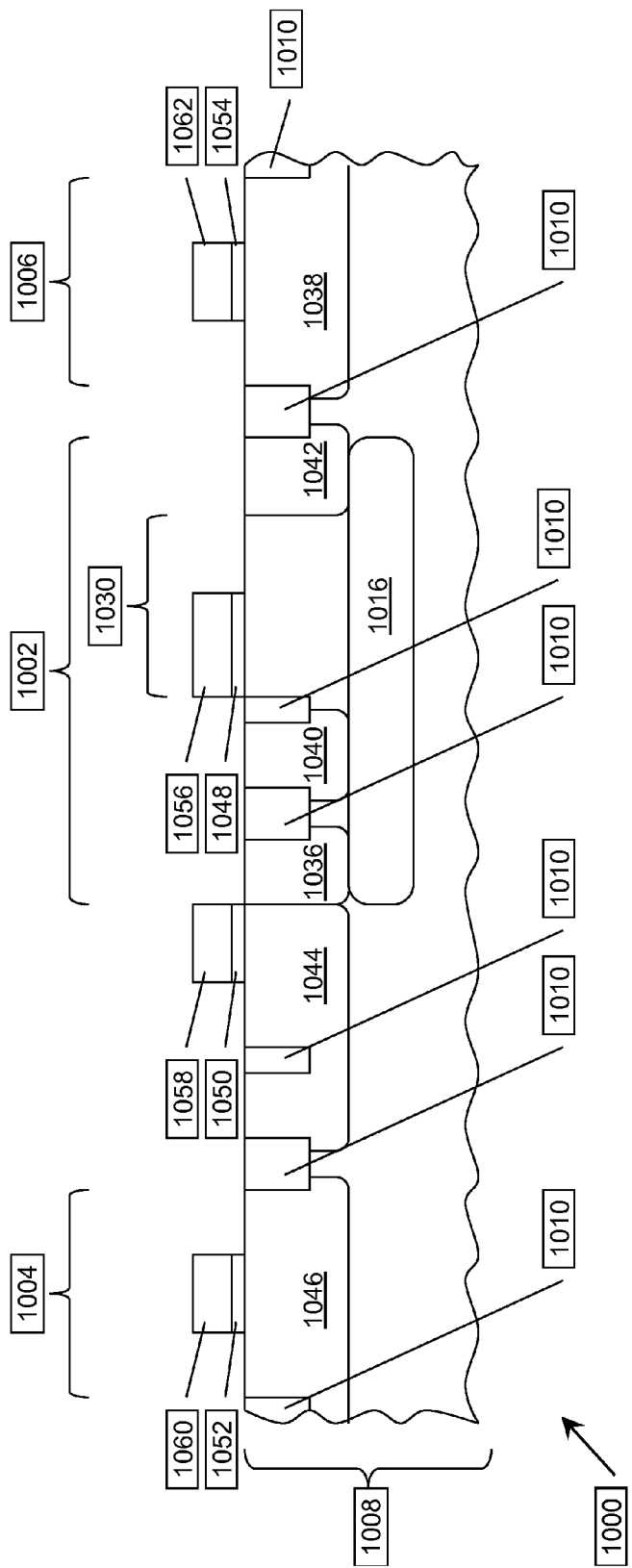

Referring to FIG. 1E, an upper MOS gate dielectric layer 1048 is formed on the top surface of the substrate 1008 in the channel region 1030 adjacent to the anode well 1040. A passgate dielectric layer 1050 is formed on a top surface of the substrate 1008 over the passgate body well 1044 adjacent to the lower gate link 1036. An NMOS gate dielectric layer 1052 is formed on the top surface of the substrate 1008 over the NMOS body well 1046. A PMOS gate dielectric layer 1054 is formed on the top surface of the substrate 1008 over the PMOS body well 1038. Any combination of the upper MOS gate dielectric layer 1048, the passgate dielectric layer 1050, the NMOS gate dielectric layer 1052 and the PMOS gate dielectric layer 1054 may be formed concurrently, possibly advantageously reducing fabrication cost and complexity of the integrated circuit 1000. The gate dielectric layers 1048, 1050, 1052 and 1054 may be one or more layers of silicon dioxide ($SiO_2$), silicon oxy-nitride (SiON), aluminum oxide ($Al_2O_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The gate dielectric layers 1048, 1050, 1052 and 1054 may include nitrogen as a result of exposure to a nitrogen containing plasma or a nitrogen containing ambient gas at temperatures between 50 C and 800 C. The gate dielectric layers 1048, 1050, 1052 and 1054 may be between 2 and 10 nanometers thick. The gate dielectric layers 1048, 1050, 1052 and 1054 may be formed by any of a variety of gate dielectric formation processes, for example thermal oxidation, plasma nitridation of an oxide layer, and/or dielectric material deposition by atomic layer deposition (ALD).

An upper MOS gate 1056 is formed on the upper MOS gate dielectric layer 1048, a passgate gate 1058 is formed on the passgate dielectric layer 1050, an NMOS gate 1060 is formed on the NMOS gate dielectric layer 1052 and a PMOS gate 1062 is formed on the PMOS gate dielectric layer 1054. Any combination of the upper MOS gate 1056, the passgate gate 1058, the NMOS gate 1060 and the PMOS gate 1062 may be formed concurrently, possibly advantageously reducing fabrication cost and complexity of the integrated circuit 1000. The upper MOS gate 1056, the passgate gate 1058, the NMOS gate 1060 and the PMOS gate 1062 may be polycrystalline silicon, commonly referred to as polysilicon, metal such as titanium nitride, metal silicide such as nickel silicide or cobalt silicide, or other electrically conductive material.

Figure 1F:
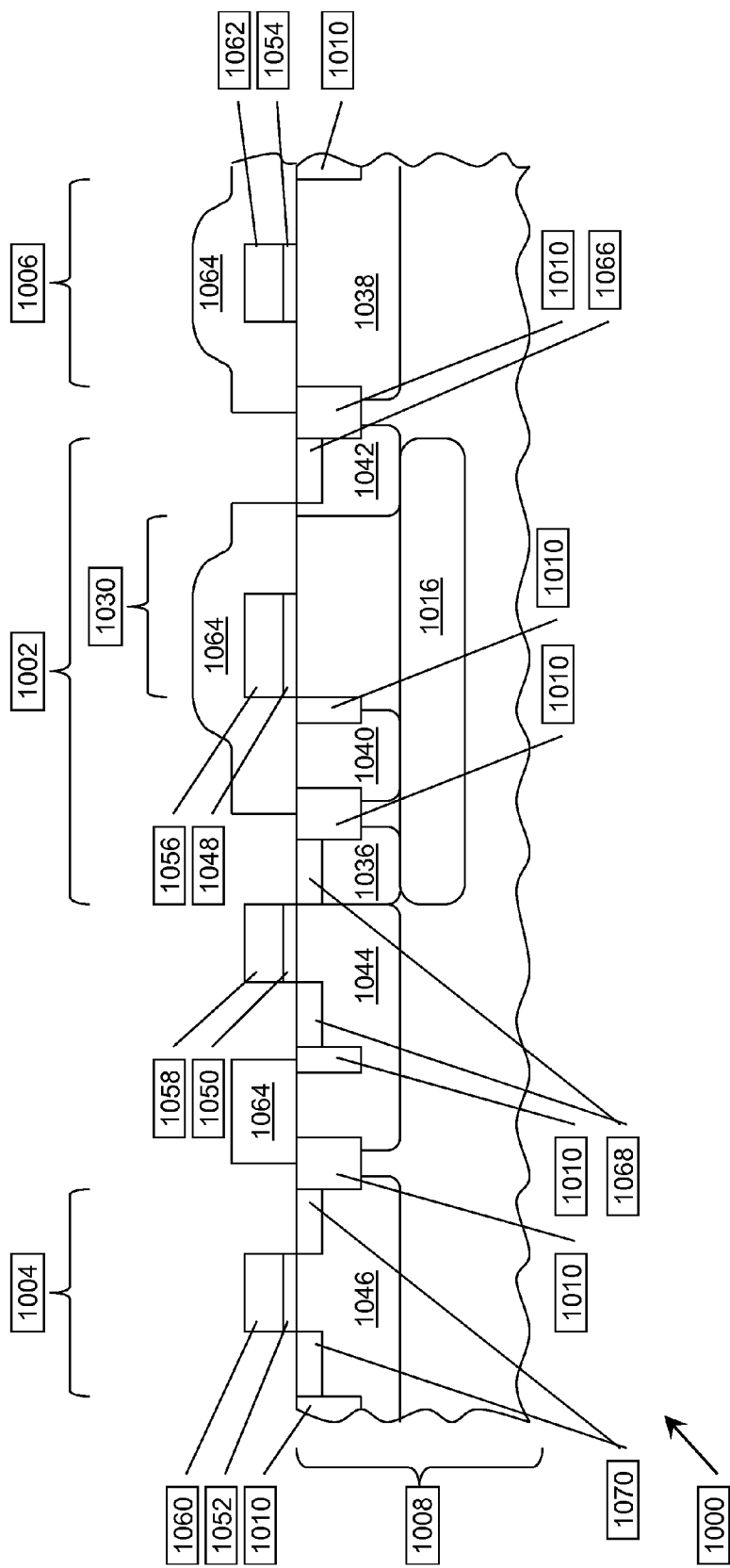

Referring to FIG. 1F, an n-channel source/drain (NSD) ion implant mask 1064 is formed over the substrate 1008 so as to expose the substrate 1008 in an area to be implanted in the field controlled diode area 1002, and possibly in the NMOS transistor area 1004. The NSD ion implant mask 1064 may be formed of photoresist for example between 500 nanometers and 800 nanometers thick. An NSD ion implant operation is performed on the integrated circuit 1000 which implants n-type dopants such as phosphorus and arsenic into the substrate 1008 to form a field controlled diode cathode implanted layer 1066 in the cathode well 1042, a pair of passgate source/drain implanted layers 1068 adjacent to and on opposite sides of the passgate gate 1058, and a pair of NMOS source/drain implanted layers 1070 adjacent to and on opposite sides of the NMOS gate 1060. In one version of the instant embodiment, the NSD ion implant operation may implant the n-type dopants at a dose between $1\times10^{15}$ atoms/$cm^2$ and $1\times10^{16}$ atoms/$cm^2$ at an average depth between 50 nanometers and 250 nanometers. The NSD ion implant mask 1064 may be removed after the NSD ion implant operation is completed.

Figure 1G:
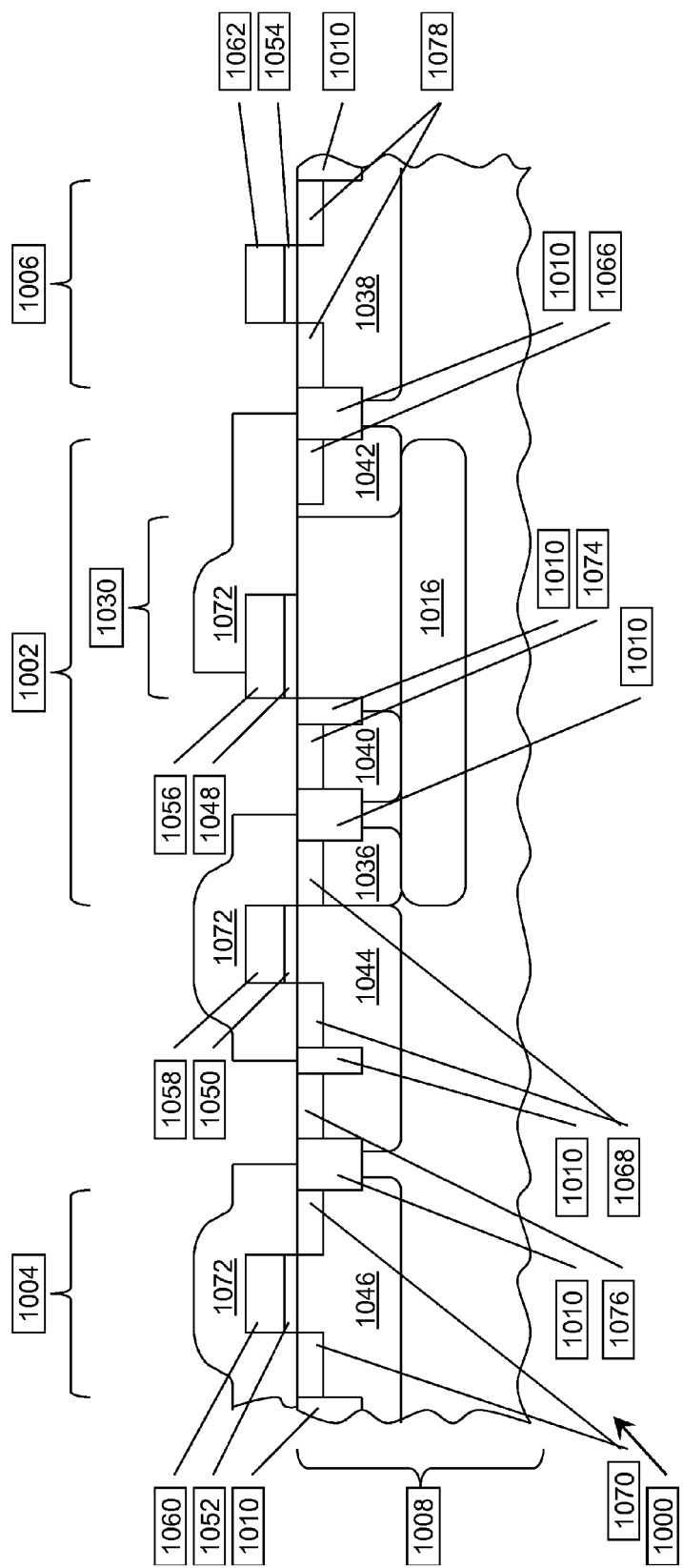

Referring to FIG. 1G, a p-channel source/drain (PSD) ion implant mask 1072 is formed over the substrate 1008 so as to expose the substrate 1008 in an area to be implanted in the field controlled diode area 1002, and possibly in the PMOS transistor area 1006. The PSD ion implant mask 1072 may be formed of photoresist for example between 500 nanometers and 800 nanometers thick. A PSD ion implant operation is performed on the integrated circuit 1000 which implants p-type dopants such as boron and possibly gallium and indium into the substrate 1008 to form a field controlled diode anode implanted layer 1074 in the anode well 1040, a passgate body contact implanted layer 1076 in the passgate body well 1044, and a pair of PMOS source/drain implanted layers 1078 adjacent to and on opposite sides of the PMOS gate 1062. In one version of the instant embodiment, the PSD ion implant operation may implant the p-type dopants at a dose between $1\times10^{15}$ atoms/$cm^2$ and $1\times10^{16}$ atoms/$cm^2$ at an average depth between 50 nanometers and 250 nanometers. The PSD ion implant mask 1072 may be removed after the PSD ion implant operation is completed.

Figure 1H:
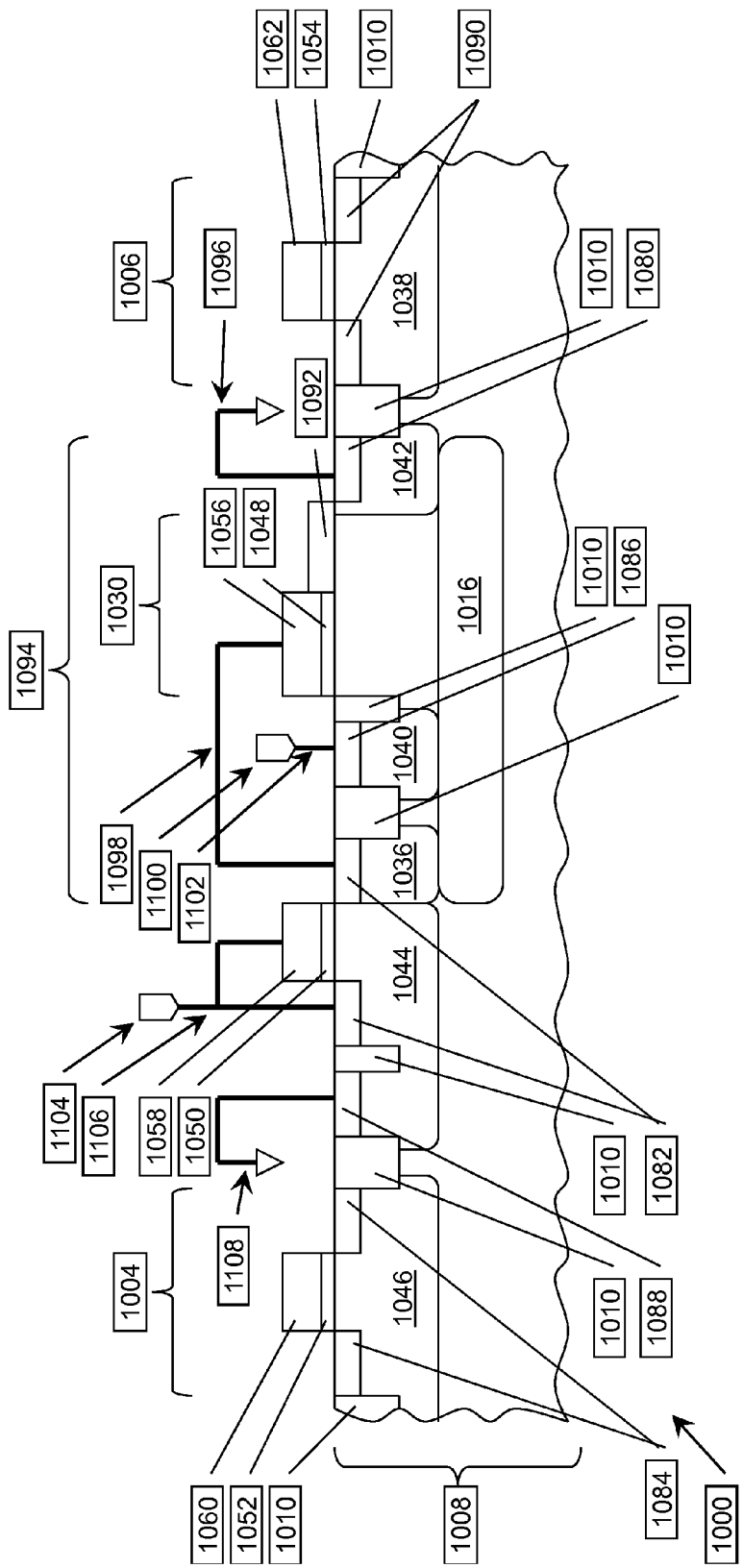

Referring to FIG. 1H, a source/drain anneal operation is performed on the integrated circuit 1000 which heats the substrate 1008 causing at least a portion of the dopants implanted in the NSD ion implant operation and the PSD implant operation to become activated. The n-type dopants in the field controlled diode cathode implanted layer 1066 of FIG. 1G form an n-type field controlled diode cathode 1080. The n-type dopants in the passgate source/drain implanted layers 1068 of FIG. 1G form passgate source/drain regions 1082. The passgate source/drain region 1082 in the lower gate link 1036 provides a contact region for the lower gate link 1036 to the lower depletion gate 1016. The n-type dopants in the NMOS source/drain implanted layers 1070 of FIG. 1G form NMOS source/drain regions 1084. The p-type dopants in the field controlled diode anode implanted layer 1074 of FIG. 1G form a field controlled diode anode 1086. The p-type dopants in the passgate body contact implanted layer 1076 of FIG. 1G form a passgate body contact 1088. The p-type dopants in the PMOS source/drain implanted layers 1078 of FIG. 1G form PMOS source/drain regions 1090. A layer of silicide block dielectric layer 1092 such as silicon nitride is formed on a top surface of the substrate 1008 over the channel region 1030 between the upper MOS gate 1056 and the field controlled diode cathode 1080 so as to prevent metal silicide formation on a surface of the channel region 1030. The p-type field controlled diode anode 1086, the p-type anode well 1040, the p-type channel region 1030, the n-type field controlled diode cathode 1080, the p-type cathode well 1042, the n-type lower depletion gate 1016, the n-type lower gate link 1036, the upper MOS gate dielectric layer 1048 and the upper MOS gate 1056 and the silicide block dielectric layer 1092 form a field controlled diode 1094. The silicide block dielectric layer 1092 is a surface control element for the channel region 1030.

In one version of the instant embodiment, the field controlled diode 1094 may have a linear configuration which is electrically isolated by a dielectric structure such as deep trench isolation. In another version, the field controlled diode 1094 may have a closed loop layout such as a circle or racetrack configuration.

Forming the NMOS source/drain regions 1084 concurrently with the field controlled diode cathode 1080 and the passgate source/drain regions 1082 may advantageously reduce fabrication cost and complexity of the integrated circuit 1000. Similarly, forming the PMOS source/drain implanted layers 1078 and the passgate body contact 1088 concurrently with the field controlled diode anode 1086 may advantageously reduce fabrication cost and complexity of the integrated circuit 1000.

Electrical connections are made to the field controlled diode, for example by interconnect elements of the integrated circuit 1000 such as tungsten contacts, aluminum or copper interconnect lines and tungsten, aluminum or copper vias. The field controlled diode cathode 1080 is connected to a ground node of the integrated circuit 1000 as depicted schematically by cathode connection 1096. The upper MOS gate 1056 is connected to the lower gate link 1036 as depicted schematically by gate connection 1098. The field controlled diode anode 1086 is connected to an I/O pad 1100 as depicted schematically by anode connection 1102. The I/O pad 1100 may be connected to other circuits, not shown, in the integrated circuit 1000. If the optional passgate is formed, the passgate gate 1058 and the passgate source/drain region 1082 opposite from the lower gate link 1036 are connected to a control signal 1104 such as an RC trigger circuit or a Vdd node, as depicted schematically by passgate connection 1106. The passgate body contact 1088 is connected to ground as depicted schematically by ground connection 1108.

During operation of the integrated circuit 1000, a positive bias may be applied to the upper MOS gate 1056 and lower depletion gate 1016 through the lower gate link 1036 so as to deplete the channel region 1030. Depleting the channel region 1030 from above and below may provide a high electrical resistance, for example greater than $10^6$ ohms, between the field controlled diode anode 1086 and the field controlled diode cathode 1080, for signals on the I/O pad 1100 within the operating voltage range of the integrated circuit 1000. Positive voltage excursions on the I/O pad 1100 above the operating voltage range, for example ESD events, may establish a low impedance conductive path, for example less than 100 ohms, through the channel region 1030 by a majority carrier breakdown mechanism, thereby shunting the positive voltage excursion through the field controlled diode cathode 1080 to ground. The voltage on the I/O pad 1100 required to establish the low impedance conductive path through the channel region 1030 is referred to as the break-over voltage. The break-over voltage is a function of a length of the upper MOS gate 1056 in a direction of current flow through the channel region 1030. In one version of the instant embodiment, in which the upper MOS gate 1056 is between 0.9 and 1.1 microns long, the break-over voltage may be between 5 and 7 volts. In an alternate version, in which the upper MOS gate 1056 is between 5 and 6 microns long, the break-over voltage may be between 7 and 15 volts.

When the upper MOS gate 1056 and lower depletion gate 1016 are not biased, for example when the integrated circuit 1000 is unpowered, the channel region 1030 is not depleted, so that an electrical impedance between the field controlled diode anode 1086 and the field controlled diode cathode 1080 is less than a few thousand ohms. Thus, voltage excursions on the I/O pad 1100 are advantageously shunted to ground when the integrated circuit 1000 is unpowered.

Figure 2A:
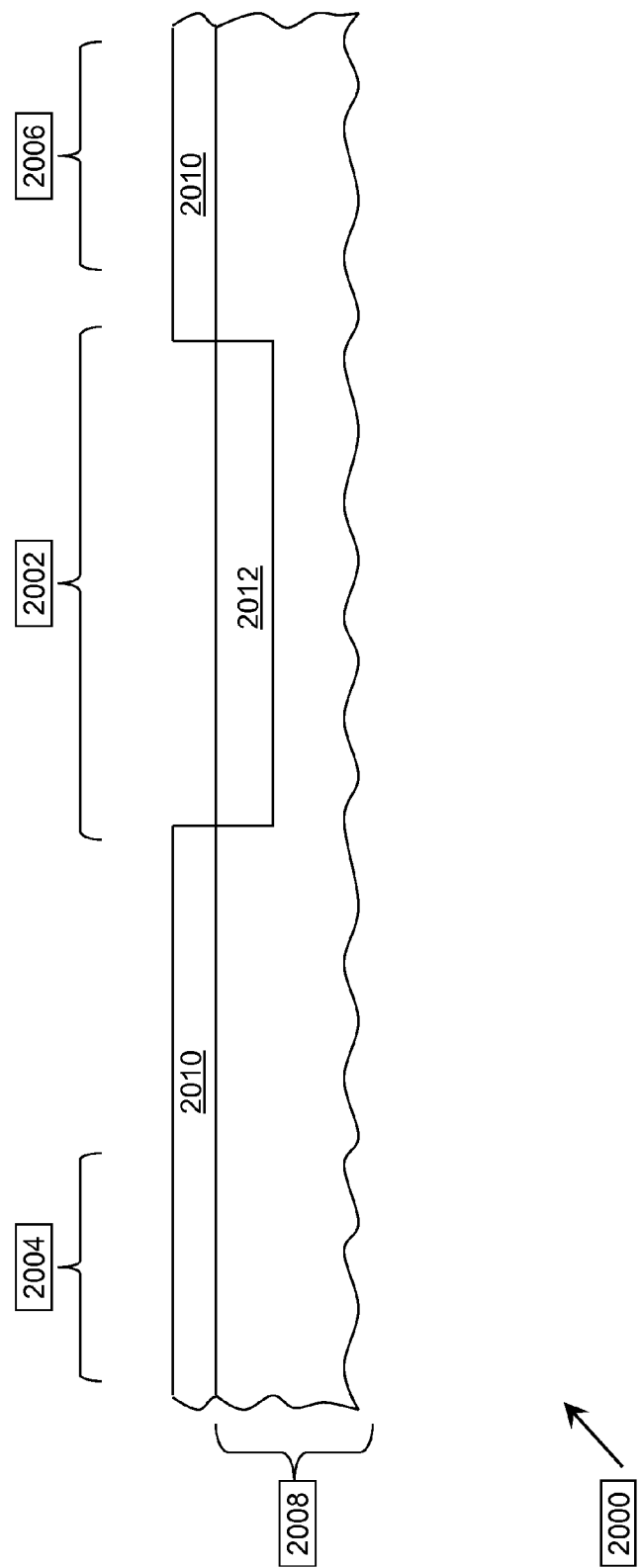
FIG. 2A through FIG. 2F are cross sections of an integrated circuit containing a field controlled diode formed according to another embodiment, depicted in successive stages of fabrication.

FIG. 2A through FIG. 2F are cross sections of an integrated circuit containing a field controlled diode formed according to another embodiment, depicted in successive stages of fabrication. Referring to FIG. 2A, the integrated circuit 2000 includes an area defined for the field controlled diode 2002, an area defined for an NMOS transistor 2004 and an area defined for a PMOS transistor 2006. The integrated circuit 2000 is formed in and on a monolithic base wafer 2008 which may be a single crystal silicon wafer, a hybrid orientation technology (HOT) wafer with regions of different crystal orientations, or other material appropriate for fabrication of the integrated circuit 2000. The base wafer 2008 is p-type in the field controlled diode area 2002. An n-type buried layer (NBL) ion implant mask 2010 is formed over the top surface of the base wafer 2008 so as to expose the base wafer 2008 in an area to be implanted in the field controlled diode area 2002. The NBL ion implant mask 2010 may be formed of photoresist between 500 nanometers and 2 microns thick, or other dielectric material such as silicon dioxide between 400 nanometers and 1.5 microns thick, for example by forming an etch mask over a layer of silicon dioxide and removing unwanted silicon dioxide by an etch process. The NBL ion implant mask 2010 may also expose the base wafer 2008 in other areas of the integrated circuit 2000. An NBL ion implant operation is performed on the integrated circuit 2000 which implants n-type dopants such as phosphorus, arsenic and/or antimony into the base wafer 2008 to form an NBL implanted layer 2012 at the top surface of the base wafer 2008. In one version of the instant embodiment, the NBL ion implant operation may implant antimony at a dose between $1 \times 10^{15}$ atoms/cm$^2$ and $6 \times 10^{15}$ atoms/cm$^2$ at an energy between 30 keV and 80 keV. The NBL ion implant mask 2010 may be removed after the deep n-type well ion implant operation is completed. An NBL drive or anneal operation may be performed on the integrated circuit 2000 which heats the base wafer 2008 so as to activate at least a portion of the n-type dopants in the NBL implanted layer 2012.

Figure 2B:
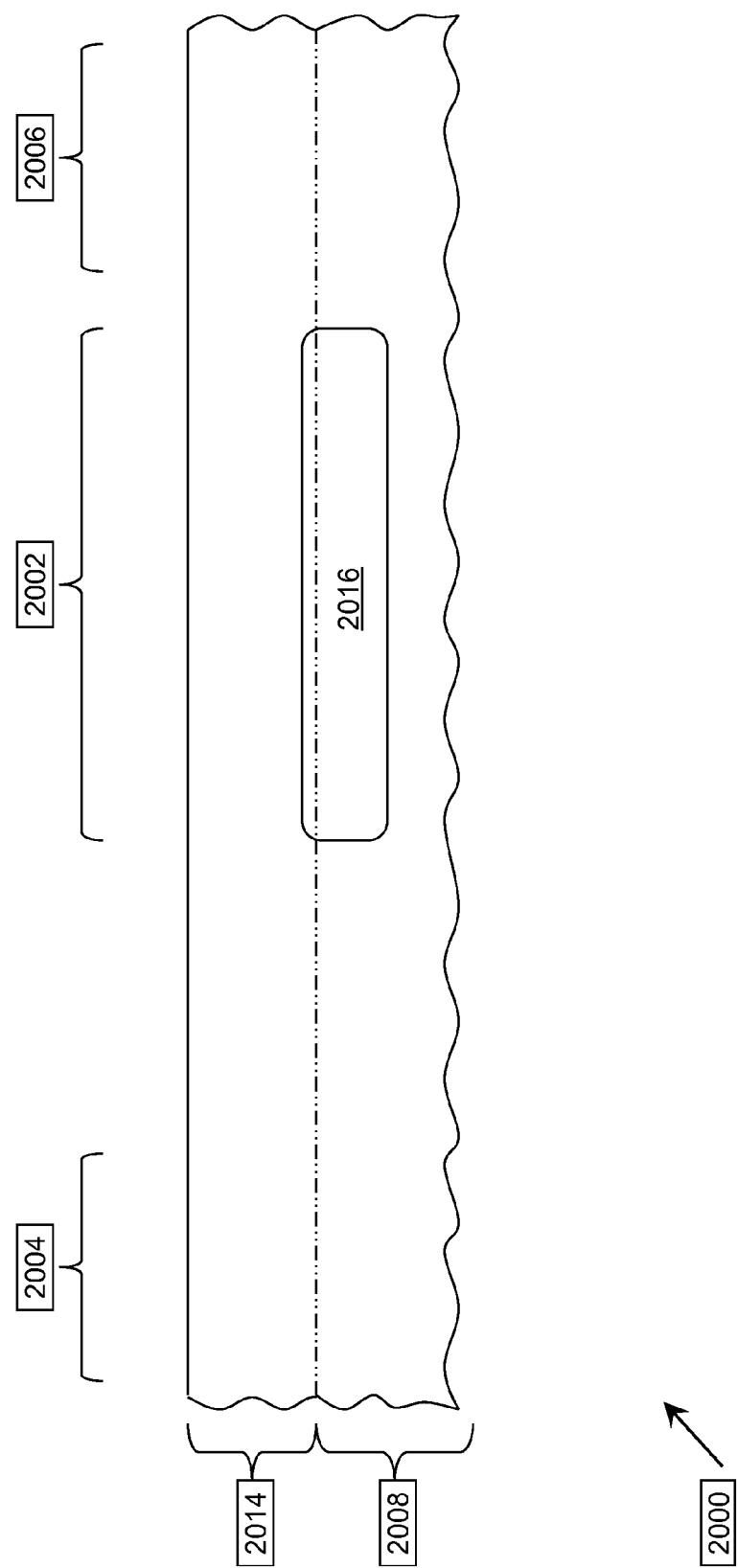

Referring to FIG. 2B, a p-type epitaxial layer 2014 is formed on the top surface of the base wafer 2008. In one version of the instant embodiment, the epitaxial layer 2014 may be between 300 nanometers and 2 microns thick. During formation of the epitaxial layer 2014, the NBL implanted layer 2012 of FIG. 2A forms a lower depletion gate 2016. The epitaxial layer 2014 in combination with the base wafer 2008 form a substrate for the integrated circuit 2000.

Figure 2C:
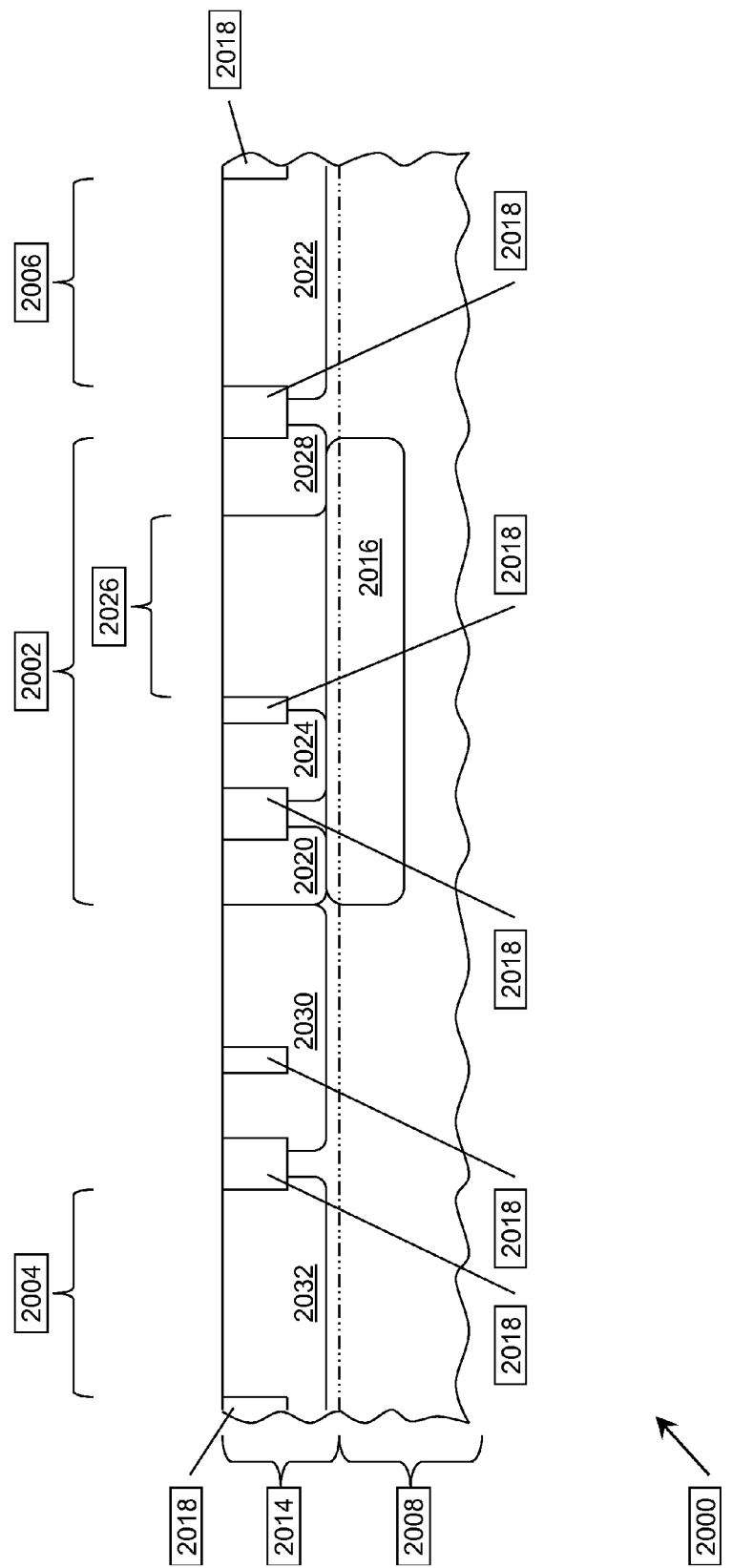

Referring to FIG. 2C, elements of field oxide 2018 are formed at a top surface of the epitaxial layer 2014 as described in reference to FIG. 1A. An n-type lower gate link 2020 which makes electrical contact with the lower depletion gate 2016 is formed in the epitaxial layer 2014, as described in reference to FIG. 1B though FIG. 1D. An n-type PMOS body well 2022 is formed in the epitaxial layer 2014 in the PMOS transistor area 2006 as described in reference to FIG. 1B though FIG. 1D. A p-type anode well 2024 is formed in the epitaxial layer 2014 over the lower depletion gate 2016 adjacent to a channel region 2026 of the field controlled diode, as described in reference to FIG. 1C and FIG. 1D. A p-type cathode well 2028 is formed in the epitaxial layer 2014 over the lower depletion gate 2016 adjacent to the channel region 2026 and opposite from the anode well 2024, as described in reference to FIG. 1C and FIG. 1D. A p-type passgate body well 2030 is formed in the epitaxial layer 2014 adjacent to the field controlled diode area 2002 as described in reference to FIG. 1C and FIG. 1D. A p-type NMOS body well 2032 is formed in the epitaxial layer 2014 in the NMOS transistor area 2004 as described in reference to FIG. 1C and FIG. 1D.

Figure 2D:
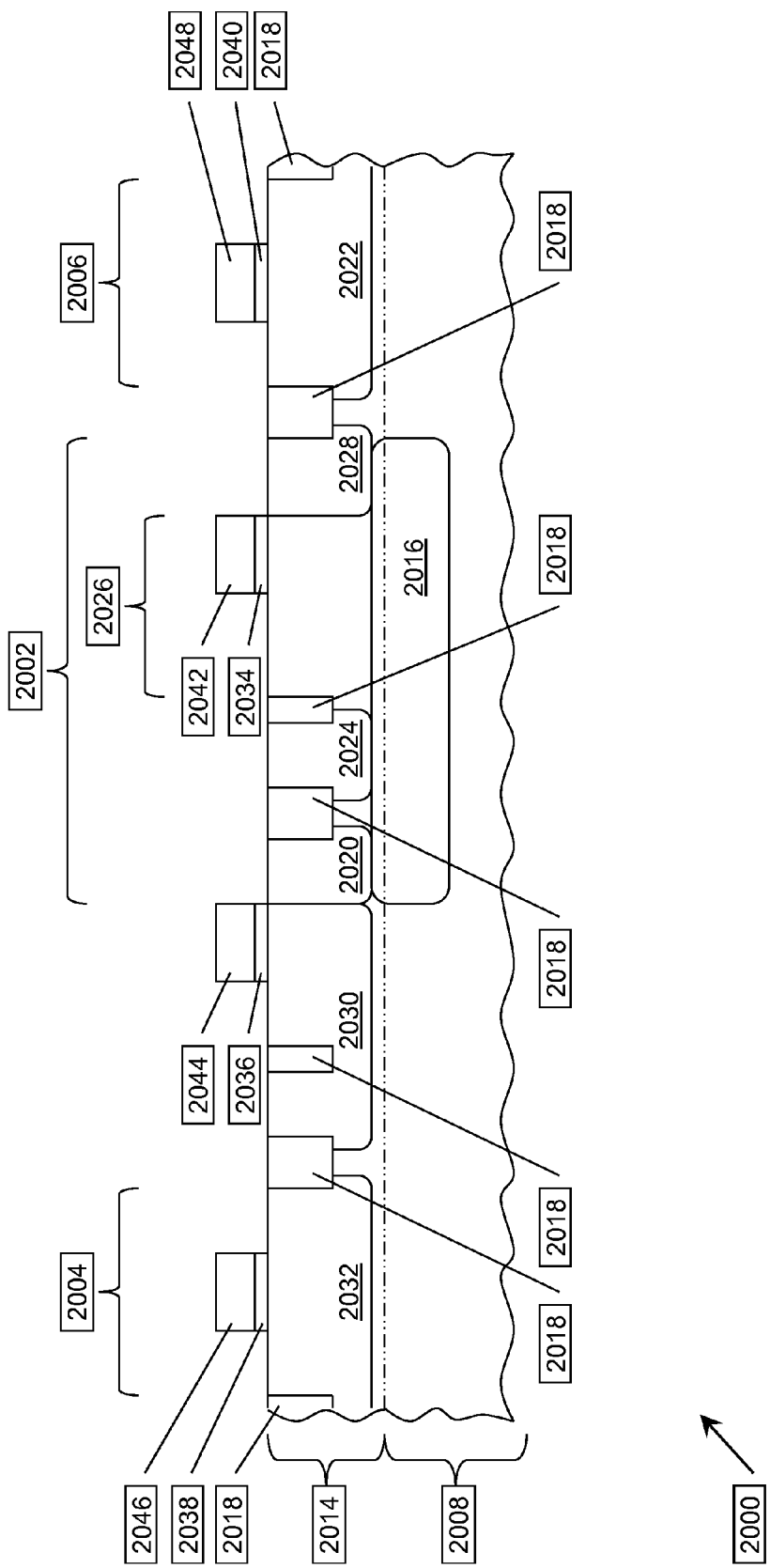

Referring to FIG. 2D, a field plate dielectric layer 2034 is formed on the top surface of the base wafer 2008 in the channel region 2026 adjacent to the cathode well 2028. A passgate dielectric layer 2036 is formed on a top surface of the base wafer 2008 over the passgate body well 2030 adjacent to the lower gate link 2020. An NMOS gate dielectric layer 2038 is formed on the top surface of the base wafer 2008 over the NMOS body well 2032. A PMOS gate dielectric layer 2040 is formed on the top surface of the base wafer 2008 over the PMOS body well 2022. Any combination of the field plate dielectric layer 2034, the passgate dielectric layer 2036, the NMOS gate dielectric layer 2038 and the PMOS gate dielectric layer 2040 may be formed concurrently, possibly advantageously reducing fabrication cost and complexity of the integrated circuit 2000. The dielectric layers 2034, 2036, 2038 and 2040 may be formed as described in reference to FIG. 1E.

A field plate 2042 is formed on the field plate dielectric layer 2034, a passgate gate 2044 is formed on the passgate dielectric layer 2036, an NMOS gate 2046 is formed on the NMOS gate dielectric layer 2038 and a PMOS gate 2048 is formed on the PMOS gate dielectric layer 2040, as described in reference to FIG. 1E. Any combination of the field plate 2042, the passgate gate 2044, the NMOS gate 2046 and the PMOS gate 2048 may be formed concurrently, possibly advantageously reducing fabrication cost and complexity of the integrated circuit 2000.

Figure 2E:
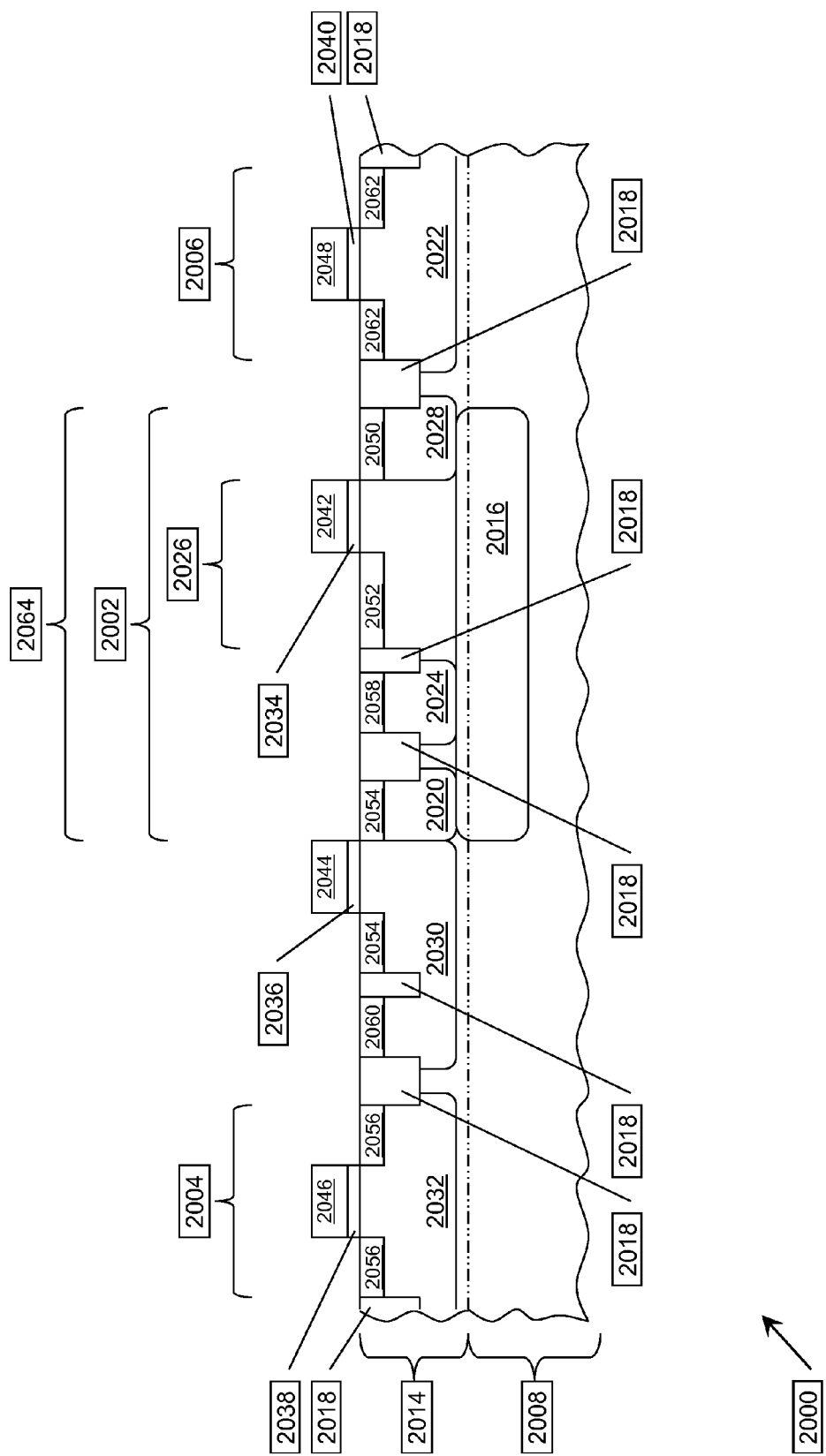

Referring to FIG. 2E, an NSD ion implant operation and a PSD ion implant operation are performed on the integrated circuit 2000 through appropriate ion implant masks followed by a source/drain anneal as described in reference to FIG. 1F through FIG. 1H, to form an n-type field controlled diode cathode 2050 in the cathode well 2028, an n-type upper depletion gate 2052 in the channel region 2026 between the field plate 2042 and the anode well 2024, a pair of n-type passgate source/drain implanted layers 2054 adjacent to and on opposite sides of the passgate gate 2044, a pair of n-type NMOS source/drain implanted layers 2056 adjacent to and on opposite sides of the NMOS gate 2046, a p-type field controlled diode anode 2058 in the anode well 2024, a passgate body contact implanted layer 2060 in the passgate body well 2030, and a pair of PMOS source/drain implanted layers 2062 adjacent to and on opposite sides of the PMOS gate 2048. The p-type field controlled diode anode 2058, the p-type anode well 2024, the p-type channel region 2026, the n-type field controlled diode cathode 2050, the p-type cathode well 2028, the n-type lower depletion gate 2016, the n-type lower gate link 2020, the upper depletion gate 2052, the field plate dielectric layer 2034 and the field plate 2042 form a field controlled diode 2064. The field plate dielectric layer 2034 and the field plate 2042 combine to form a surface control element for the channel region 2026. In one version of the instant embodiment, the field controlled diode 2064 may have a linear configuration electrically isolated by a dielectric structure. In another version, the field controlled diode 2064 may have a closed loop layout.

Figure 2F:
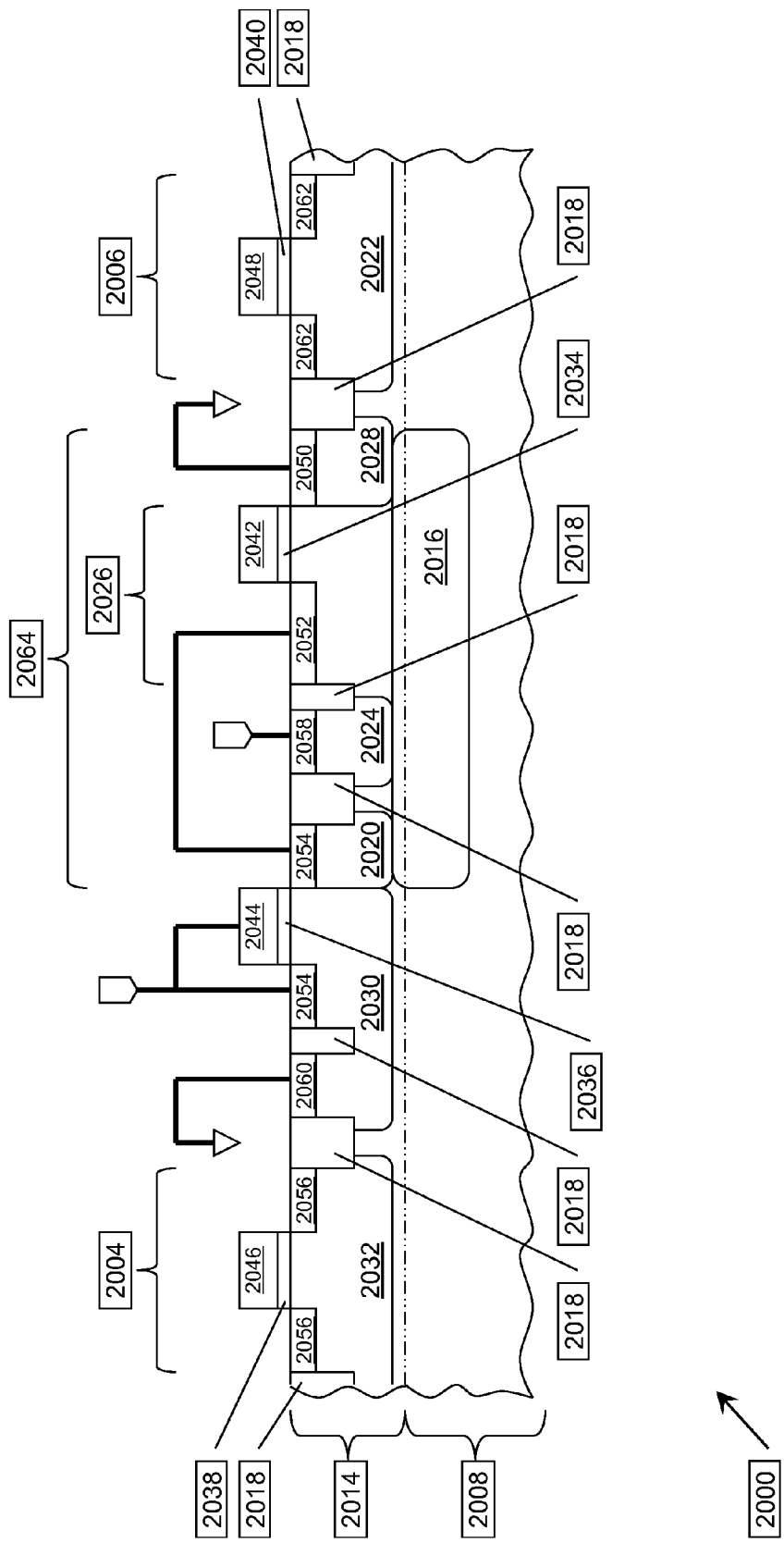

Referring to FIG. 2F, electrical connections are made to the field controlled diode 2064, as described in reference to FIG. 1H. During operation of the integrated circuit 2000, the upper depletion gate 2052 and the lower depletion gate 2016 may be biased as described in reference to FIG. 1H, to deplete the channel region 2026. The field plate 2042 may be biased to adjust a surface potential under the field plate dielectric layer 2034 to provide a desired break-over voltage in the field controlled diode 2064. It will be recognized that the advantages of the embodiment described in reference to FIG. 1A through FIG. 1H may be provided by the instant embodiment.

Figure 3:
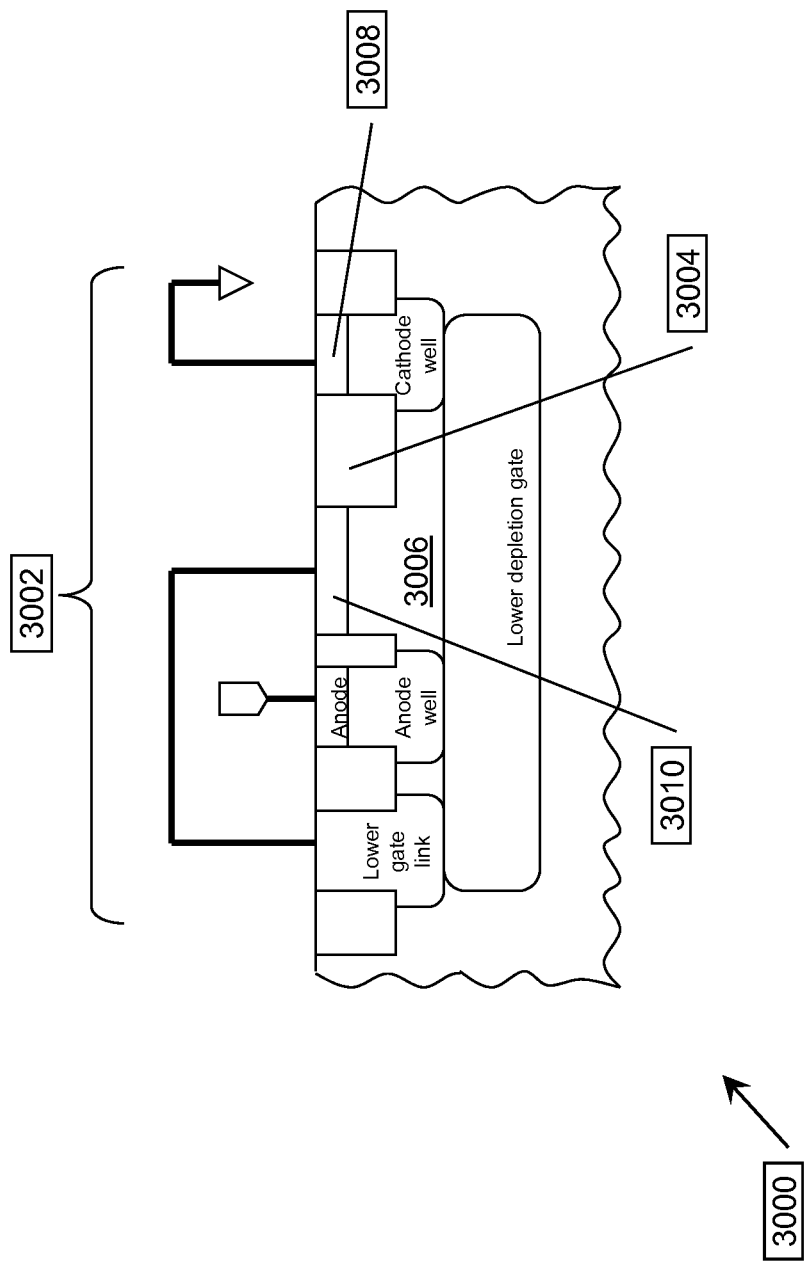
FIG. 3 is a cross section of an integrated circuit containing a field controlled diode formed according to a further embodiment.

FIG. 3 is a cross section of an integrated circuit containing a field controlled diode formed according to a further embodiment. The integrated circuit 3000 contains the field controlled diode 3002 which has an element of field oxide 3004 in a p-type channel region 3006 between an n-type field controlled diode cathode 3008 and an n-type upper depletion gate 3010. The field oxide 3004 may advantageously prevent formation of a conductive path, such as an inversion layer, between the field controlled diode cathode 3008 and the upper depletion gate 3010.

It will be recognized that a field controlled diode may be formed within the scope of the instant invention having any manifestation of upper gate including an MOS gate or a depletion gate, in combination with any manifestation of surface control element in a channel region of the field controlled diode including a field plate, a silicide block dielectric layer or a field oxide element. The field controlled diode may optionally be integrated with a passgate.

Figure 4:
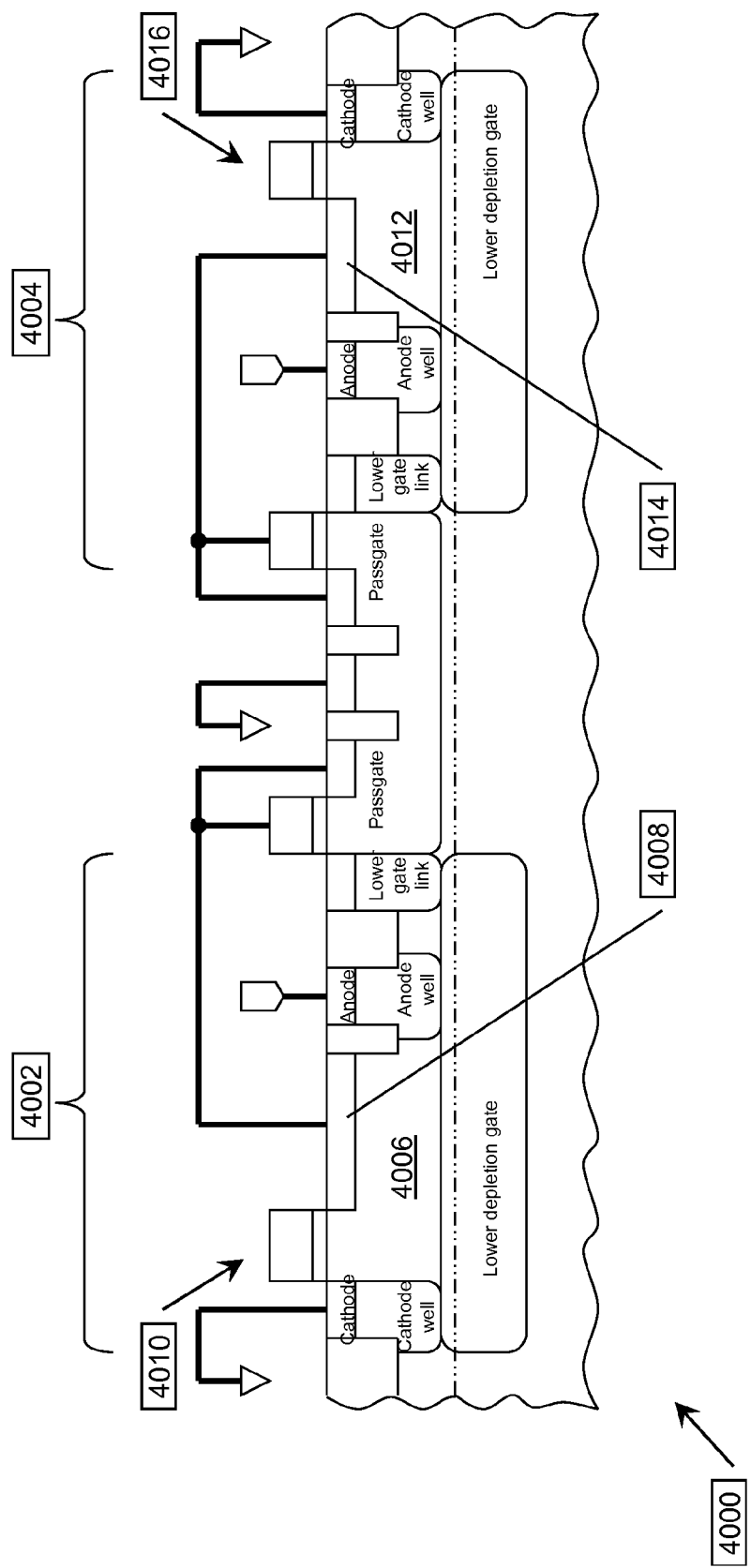
FIG. 4 is a cross section of an integrated circuit containing two field controlled diodes formed according to an embodiment.

FIG. 4 is a cross section of an integrated circuit containing two field controlled diodes formed according to an embodiment. The integrated circuit 4000 has a first field controlled diode 4002 and a second field controlled diode 4004. The first field controlled diode 4002 has a first configuration of channel region 4006, upper gate 4008 and surface control element 4010 so as to provide a first break-over voltage. The second field controlled diode 4004 has a second configuration of channel region 4012, upper gate 4014 and surface control element 4016 so as to provide a second break-over voltage which is at least 2 volts less than the first break-over voltage. The first upper gate 4008 and the second upper gate 4014 are formed concurrently. The first surface control element 4010 and the second surface control element 4016 are formed concurrently.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising:
   providing a monolithic p-type semiconductor substrate; and
   forming a first field controlled diode, by a process including the steps:
   forming an n-type lower depletion gate in said substrate under a channel region located in said substrate;
   forming an n-type well ion implant mask over a top surface of said substrate so as to expose said substrate in an area to be implanted in an area defined for said field controlled diode;
   performing an n-type well ion implant operation on said integrated circuit so as to implant n-type dopants through said exposed area of said n-type well ion implant mask into said substrate to form a lower gate link implanted layer in said field controlled diode area over a portion of said lower depletion gate;
   forming a p-type well ion implant mask over said top surface of said substrate so as to expose said substrate in an area to be implanted in an area defined for said field controlled diode;
   performing a p-type well ion implant operation on said integrated circuit so as to implant p-type dopants through said exposed area of said p-type well ion implant mask into said substrate to form an anode well implanted layer in said field controlled diode area abutting said channel region and over a portion of said lower depletion gate, and to form a cathode well implanted layer in said field controlled diode area abutting said channel region opposite from said anode well implanted layer and over a portion of said lower depletion gate;

performing a well anneal operation on said integrated circuit which heats said substrate so that at least a portion of said n-type dopants implanted into said substrate during said n-type well ion implant operation and at least a portion of said p-type dopants implanted into said substrate during said p-type well ion implant operation to become electrically activated, so that:

said n-type dopants in said lower gate link implanted layer form a lower gate link in said substrate contacting an upper surface of said lower depletion gate;

said p-type dopants in said anode well implanted layer form an anode well in said substrate contacting said upper surface of said lower depletion gate; and said p-type dopants in said cathode well implanted layer form an cathode well in said substrate contacting said upper surface of said lower depletion gate;

forming an upper gate at said top surface of said substrate over said channel region adjacent to said anode well;

forming a surface control element at said top surface of said substrate over said channel region between said upper gate and said cathode well;

forming an n-channel source/drain (NSD) ion implant mask over a top surface of said substrate so as to expose said substrate in an area to be implanted in an area defined for said field controlled diode;

performing an NSD ion implant operation on said integrated circuit so as to implant n-type dopants through said exposed area of said NSD ion implant mask into said substrate to form a cathode implanted layer in said field controlled diode area in said cathode well;

forming a p-channel source/drain (PSD) ion implant mask over said top surface of said substrate so as to expose said substrate in an area to be implanted in an area defined for said field controlled diode;

performing a PSD ion implant operation on said integrated circuit so as to implant p-type dopants through said exposed area of said PSD ion implant mask into said substrate to form an anode implanted layer in said field controlled diode area in said anode well; and performing a source/drain anneal operation on said integrated circuit which heats said substrate so that at least a portion of said n-type dopants implanted into said substrate during said NSD ion implant operation and at least a portion of said p-type dopants implanted into said substrate during said PSD ion implant operation to become electrically activated, so that:

said n-type dopants in said cathode implanted layer form cathode in said substrate in said cathode well; and said p-type dopants in said anode implanted layer form an anode in said substrate in said anode well.

2. The process of claim 1, further including the step of forming an electrical connection between said anode and an I/O pad of said integrated circuit.

3. The process of claim 1, in which said step of forming said upper gate includes the steps of forming an upper gate dielectric layer on said top surface of said substrate and forming an upper MOS gate on said upper gate dielectric layer.

4. The process of claim 1, in which said step of forming said upper gate includes the step of ion implanting n-type dopants into said substrate adjacent to said anode to form an n-type upper depletion gate.

5. The process of claim 1, in which said step of forming said surface control element includes the steps of forming a field plate dielectric layer on said top surface of said substrate and forming a field plate located on said field plate dielectric layer.

6. The process of claim 1, in which said step of forming said surface control element includes the step of forming a silicide block dielectric layer on said top surface of said substrate.

7. The process of claim 1, in which said step of forming said surface control element includes the step of forming an element of field oxide at said top surface of said substrate.

8. The process of claim 1, in which:
said upper gate is between 0.9 and 1.1 microns long; and
a break-over voltage of said field controlled diode is between 5 and 7 volts.

9. The process of claim 1, further including forming an n-channel passgate transistor located adjacent to said field controlled diode, by a process including the steps of:
forming a passgate dielectric layer on said top surface of said substrate adjacent to said lower gate link;
forming a passgate gate on said passgate dielectric layer;
forming a pair of n-type source/drain regions of said passgate transistor adjacent to said passgate gate so that one of said pair of source/drain regions of said passgate is located in said lower gate link.

10. The process of claim 1, further including the steps of:
forming n-type source/drain regions of an NMOS transistor in said integrated circuit concurrently with said cathode; and
forming p-type source/drain regions of a PMOS transistor in said integrated circuit concurrently with said anode.

* * * * *